US008491192B2

(12) United States Patent
Brensinger et al.

(10) Patent No.: US 8,491,192 B2
(45) Date of Patent: Jul. 23, 2013

(54) OUTDOOR EQUIPMENT

(75) Inventors: Cam Brensinger, Arlington, MA (US); Suzanne Turell, Nashua, NH (US)

(73) Assignee: Nemo Equipment, Inc., Dover, NH (US)

( * ) Notice: Subject to any disclaimer, the term of this patent is extended or adjusted under 35 U.S.C. 154(b) by 52 days.

(21) Appl. No.: 13/197,184

(22) Filed: Aug. 3, 2011

(65) Prior Publication Data

US 2012/0031448 A1 Feb. 9, 2012

Related U.S. Application Data

(60) Provisional application No. 61/370,238, filed on Aug. 3, 2010.

(51) Int. Cl.

| | |
|---|---|
| ***B65D 33/00*** | (2006.01) |
| ***B65D 30/08*** | (2006.01) |
| ***B65D 85/00*** | (2006.01) |
| ***H05K 9/00*** | (2006.01) |

(52) U.S. Cl.
USPC ............ 383/105; 383/109; 206/720; 174/378

(58) Field of Classification Search
USPC .................... 383/105, 109; 206/720; 174/378
See application file for complete search history.

(56) References Cited

U.S. PATENT DOCUMENTS

| | | | | |
|---|---|---|---|---|
| 4,471,872 | A * | 9/1984 | Dedow | 206/720 |
| 5,791,485 | A * | 8/1998 | Carbonneau | 206/720 |
| 7,075,798 | B2 * | 7/2006 | Hendrickson | 361/818 |
| 7,601,921 | B2 * | 10/2009 | Schroader | 174/372 |
| 7,772,504 | B1 * | 8/2010 | Tashjian | 174/380 |
| 7,880,083 | B2 * | 2/2011 | Livne | 174/50 |
| 2003/0057131 | A1 * | 3/2003 | Diaferia | 206/719 |
| 2005/0092504 | A1 * | 5/2005 | Walthall et al. | 174/35 MS |
| 2006/0196792 | A1 * | 9/2006 | Barth et al. | 206/320 |
| 2007/0142103 | A1 * | 6/2007 | Livne | 455/575.5 |
| 2011/0290676 | A1 * | 12/2011 | Kershenstein | 206/37 |
| 2012/0055824 | A1 * | 3/2012 | Nash | 206/320 |
| 2012/0114270 | A1 * | 5/2012 | Roberts | 383/109 |

* cited by examiner

*Primary Examiner* — Jes F Pascua
(74) *Attorney, Agent, or Firm* — Bourque and Associates, PA

(57) ABSTRACT

The present invention features a lightweight compact pump design, a cloaking pouch to block wireless signals, a rescue enclosure for a litter basket, a sliding mechanism for a tent, a shoulder strap for a sleeping bag, a holding device for a tent pole, an interchangeable fly or cover for a tent and a modular sleep system.

1 Claim, 8 Drawing Sheets

OUTDOOR EQUIPMENT

CROSS-REFERENCE TO RELATED APPLICATIONS

This application claims priority from U.S. Provisional Patent Application No. 61/370,238 titled "Outdoor Equipment" filed on Aug. 3, 2010 and incorporated fully herein by reference.

TECHNICAL FIELD

The present invention relates to outdoor equipment and more particularly, relates to a lightweight air pump, a cloaking pouch to block wireless signals, a rescue enclosure for a litter basket, a sliding mechanism for a tent, a shoulder strap for a sleeping bag, a holding device for a tent pole, an interchangeable fly or cover for a tent and a modular sleep system.

BACKGROUND INFORMATION

Inflatable air pads for camping and backpacking are becoming very popular and replacing older self-inflating foam-filled designs. Some camping and backpacking pads include built-in pumps, but in order to reduce weight, packed size, and cost, many air pads do not include pumps. A standard air filled sleeping pad of a couple inches thickness, 25" width and 75" length contains a large air volume for inflation with one's lungs. Various air pumps exist for inflating products that hold air, such as inflatable air pads. Some of these air pumps require an electrical connection or a charge held in a battery. Other pumps are operated by a user's foot. Most pumps are rather large and some are very heavy and not conducive for carrying when hiking, backpacking or camping in remote areas. Additionally, current pumps cannot be compacted into a very small and lightweight format for travel. What is needed is a small pump, which is lightweight, packs small, and allows quick and easy inflation of a sleeping pad and other inflatable products for backcountry use.

Devices designed to block cellular and wireless service are often expensive and bulky. Designs that incorporate lightweight fabric have not been successful in blocking cellular or wireless service as the stitching or sewing patterns allow for small holes that allow the signal to escape. What is needed is a new method of stitching that allows for the use of lightweight conductive fabric while ensuring that the stitching does not allow for gaps or holes through which cellular or wireless service signals could escape.

Litter baskets have been used for a long time to allow for easy lift and removal of an injured patient. Current designs provide for blankets and tarps and other coverings to be placed over and around the patient to keep the patient warm and protected from the elements. As a result, access to the patient is extremely limited. What is needed is an easy to use covering design that allows for easy access to the patient at multiple entry points while also protecting the entire patient from the elements.

Tents are typically constructed with various door and window access panels. These doors and windows generally use a zipper system. The zipper systems often require two hand operation and do not allow a corner portion of a tent to slide upward from the ground and downward to the ground. As a result, what is needed is a new method of providing for an opening and closing system that allows for simple one hand operation and an infinite amount of positions.

Sleeping bags have typically been designed to keep a user warm during cold weather conditions while the user is sleeping. Often, a user will want to get warm in their sleeping bag, but also be able to sit up and read or cook or do another activity while keeping the sleeping bag wrapped around them. With mummy style sleeping bags, once a user unzips the bag to allow their arms to come out of the bag, the upper portion of the bag will fall off the user and no longer provide any protection. What is needed is a new sleeping bag design that allows a user to sit up while still maintaining the wrapping effect of the sleeping bag.

Tents that use a single pole in the center of the tent require that the bottom of the pole rest on the floor of the tent. In adverse conditions, such as wind, pressure is placed on the pole and the pole will often wear into and ruin the floor of the tent. What is needed is a new method or system for use in single pole design tents that protects the floor from the wear of the center pole.

Tents that feature advanced technology, such as those used by soldiers in remote areas are very expensive to produce. These tents are often exchanged within various locations, such as jungles, desserts, forests, and other locations. The color of the tent is critical in protecting the soldiers from harm, however it is too expensive to maintain an assortment of tents in multiple pattern and color variations to accommodate all of the potential places a soldier could be deployed. What is needed is an interchangeable cover that allows the same tent to be used in multiple locations while still providing critical camouflage protection.

Campers often use inflatable mattresses. Often each camper has his or her own single air mattress. When two people want to join their single air mattresses, there has not been any easy and comfortable way to accomplish this task. As a result, what is needed is a simple system that allows two single air mattresses to be combined into one large air mattress.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1A:
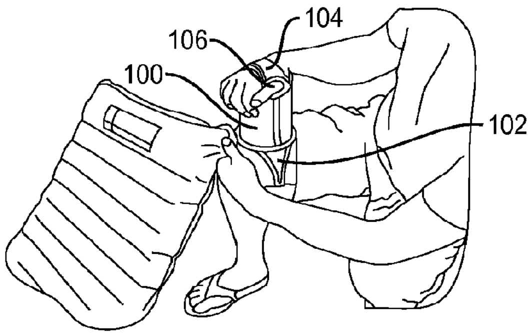
FIG. 1*a* is a detailed view of the pump of one embodiment of the present invention.
Figure 1B:
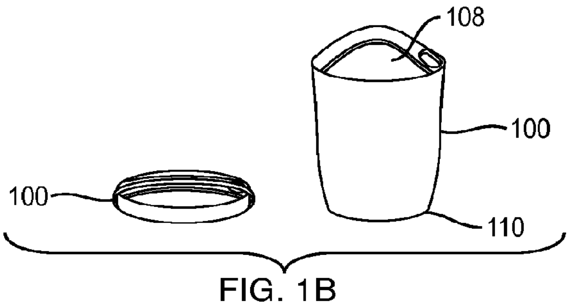
FIG. 1*b* is a view of the pump in a compressed state and an inflated state.
Figure 1C:
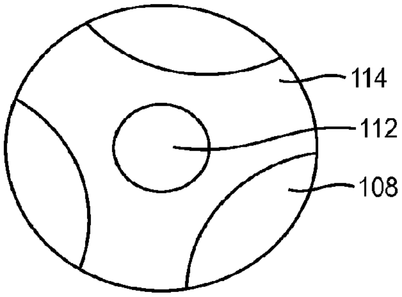
FIG. 1*c* is a detailed view of the internal fabric layer and opening of the pump of one embodiment of the present invention.
Figure 1D:
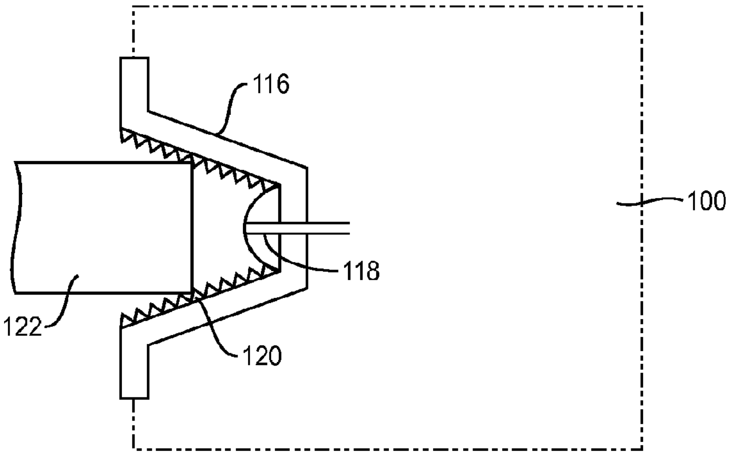
FIG. 1*d* is a detailed view of the coupling of the pump of one embodiment of the present invention.

In one embodiment of the present invention, a pump (100) is provided as shown in FIG. 1*a*. The pump (100) is preferably made from a fabric material that is sewn and/or welded, thereby making the pump (100) air and water tight and very lightweight. The pump is attachable to the thigh of a user via a lower strap (102). The lower strap (102) is preferably adjustable and/or elastic and designed to fit a wide range of thigh circumferences. The lower strap 102 wraps around the thigh and attaches with a side release buckle or other suitable attachment means, such as a hook and loop fastener. The pump (100) also features an upper strap (104). The upper strap (104) attaches to the hand of a user and may be optionally outfitted with one or more thumb holes (106). The upper strap (104) may be one continuous elastic loop or preferably a two part design that allow a user to wrap the two portions and attach on the back side of the hand via a hook and loop fastener or another attachment means. A circular plastic disc or ring (not shown) may also be provided on the inside of the pump (100) just below the upper surface (108) and just above the lower surface (110) to provide structure and stability to the pump. The upper surface (108) of the pump (100) features an opening (112). Just below the upper surface is a fabric layer (114) with a shape generally as shown in FIG. 1*c*. When the upper and lower straps (102, 104) are secured to a user, the user simply presses down on the pump (100 as shown causing the pump to collapse downward, as shown in FIG. 1*b*. This moves air through the opening and down through the pump and out through a bottom coupling (116) with an umbrella valve (118) as shown in FIG. 1*d*. The coupling is welded into a lower portion of the pump (100). The coupling (166) may feature ribs or teeth (120) that help grasp the nozzle (122) of a device to be inflated. The umbrella valve (118) prevents air from traveling back into the pump as the user re-inflates the pump by drawing their hand in an upward motion. When not in use, the upper strap (104) detaches and folds down around the sides of the pump (100) and reattaches at the bottom of the pump, allowing the pump to be stored in a fully deflated and compact format (FIG. 1*b*). The height of the pump when stored should be only slightly larger than the height of the coupling (116). The lower surface (110) of the pump (100) may also optionally feature a non-slip material or backing that prevents the pump from moving along the upper thigh of the user.

Figure 2A:
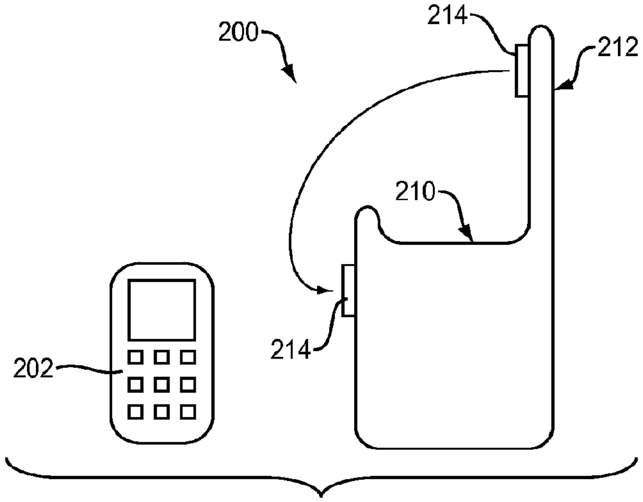
FIG. 2*a* is a detailed view of the cloaking pouch of one embodiment of the present invention.
Figure 2B:
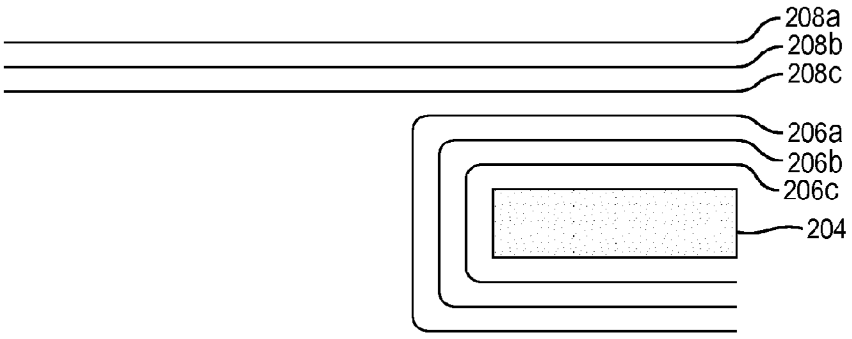
FIG. 2*b* is a detailed view of the layering of the cloaking device materials prior to stitching.
Figure 2C:
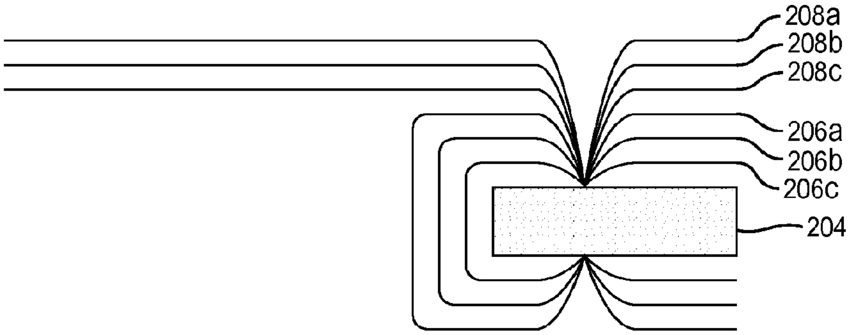
FIG. 2*c* is a detailed view of the layering of the cloaking device after stitching.

In another embodiment of the present invention, shown in FIG. 2*a*, a cloaking pouch (200) is provided. The cloaking pouch (200) is designed to accommodate a device (202) and block all cellular or wireless service to the device (202). The device can be a cell phone or other wireless device such as a personal digital assistant (PDA) or smart phone. The cloaking pouch (200) may also be designed to be large enough to accommodate a netbook, laptop, PDA, kindle or any other microprocessor based device that can handle a wireless signal. The cloaking pouch (200) features a sewing pattern with buried stitches that fully block wireless or cellular service to the device (202) once the device (202) is placed inside the cloaking pouch (200) and the cover (212) is closed using attachment means (214). As shown in FIGS. 2*b* and 2*c*, a layer of foam (204) is encased in three or more wrapping layers (206 (*a, b, c*)) of conductive material. Then an additional three or more flat layers (208 (*a, b, c*)) of conductive material are placed into contact with the wrapping layers 206. The conductive material is preferably a fabric material and may be made from a woven or nonwoven polyester or mesh blend, which may contain copper, nickel or another metal. The conductive fabric material is preferably lightweight and able to be easily designed to make any kind of shape and profile for various size cutting requirements.

When the wrapping layers (206) and flat layers (208) are sewn into the desired shape to accommodate the device (202) a buried stitch is created, whereby the stitching material passes through the flat layers (208) and through the wrapping layers (206) and into a and through the foam (204) also passing through the wrapping layers (206) on the opposite side of the foam (204). FIG. 2*b* shows the layering pattern prior to stitching and FIG. 2*c* shows the layering pattern after stitching. Unlike traditional stitching patterns, which leave tiny holes through which a cellular signal would escape, the buried stitch leaves no holes through with a cellular signal can escape. The cloaking pouch (200) features an opening (2010 that is configured to allow insertion of a device (202). The cover (212) is designed to close down over the opening and to be secured through the attachment means (214). The attachment means may be a hook and loop fastener or any other suitable attachment means.

Figure 3A:
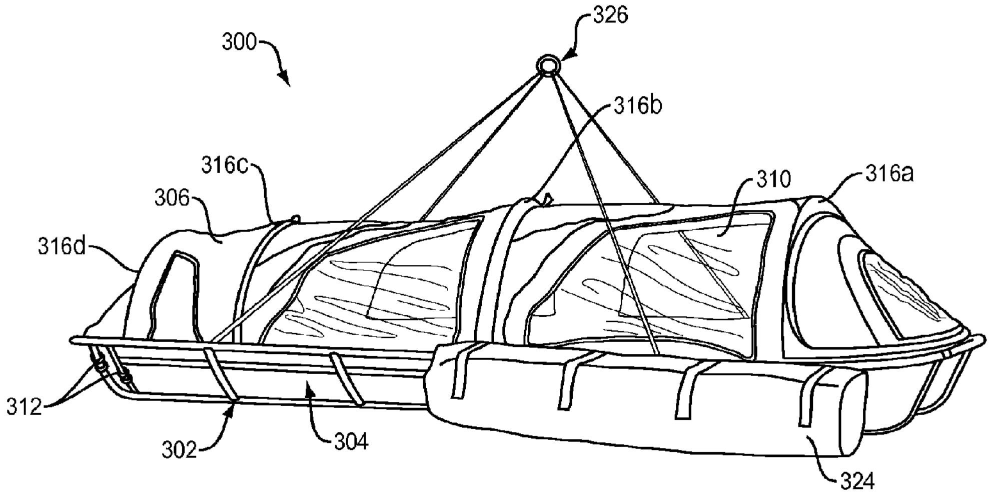
FIG. 3*a* is a detailed view of the rescue enclosure of one embodiment of the present invention.
Figure 3B:
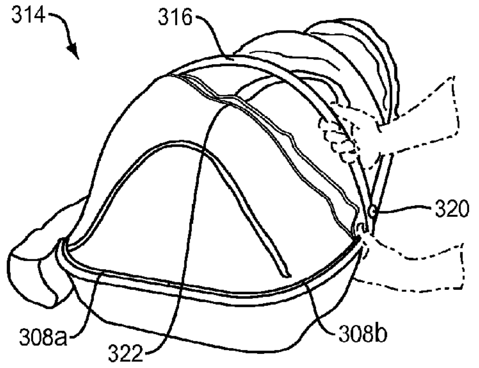
FIG. 3*b* is a detailed view of the pole system of one embodiment of the present invention.
Figure 3C:
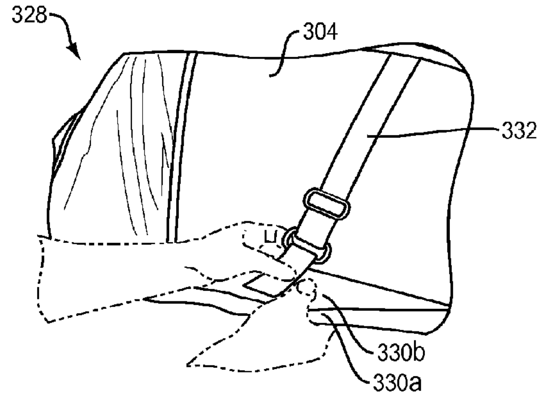
FIG. 3*c* is a detailed view of the two-piece system of one embodiment of the present invention.

In yet another embodiment of the present invention, a rescue enclosure (300) is provided that operates in conjunction with a litter basket or rescue stretcher (302) as shown in FIG. 3*a*-3*c*. The rescue enclosure (300) can be designed to fit any brand of litter basket (302) including the Stokes™ model. The rescue enclosure (300) is a multi-part design that allows for easy access to a patient while also protecting the patient from the elements such as rain, snow, wind, dust and debris. A tub bottom (304) is placed into the litter basket (302). The tub bottom is made of a fabric material. The tub bottom (304) preferably features one or more openings, such as grommets (not shown) that allow for drainage. The tub bottom (304) can be inserted in advance and can remain with the litter basket (302). The tub bottom (304) is attachable to the litter basket (302) via a daisy chain or webbing loops (312). In an alternate embodiment, the tub bottom (304) may attach to the litter basket (302) via cable ties, Velcro™, or another attachment means. A patient is then loaded in to the litter basket (302) and placed on top of the tub bottom (304). An upper tent portion (306) is then placed on top of the patient. The upper tent portion (306) is attached to the tub bottom (304) via attachment means, preferably two zippers (308*a*, 308*b*) that start at one end of the litter basket (302) and end at the opposite end of the litter basket (302). Other attachment means are contemplated and within the scope of the present invention. The upper tent portion (306) features one or more zippered windows (310) that allow for easy access to the patient from multiple angles and positions. The upper tent portion (306) also features a pole system (314) as shown in FIG. 3*b*. The pole system (314) preferably features four poles (316*a*, 316*b*, 316*c*, 316*d*), although other configurations are contemplated that would have more or fewer than four poles. The poles (316) are preferably made from a plastic, such as Delrin. A pole (316) is inserted into a sleeve (318) on the upper tent portion (306) and then inserted into a pole sheath (320). A pole zipper (322) is provided on the upper tent portion (306) and is configured to zip around and partially or completely cover the pole (316). In this way, the pole system (314) creates a small shelter or tent for the patient while also allowing the upper tent portion (306) to be completely removable from the tub bottom (304) at any point with or without the pole system (314) in place. The rescue enclosure (300) may also feature a stuff sac (324) configured to attach to the side of the litter basket (302). The stuff sac (324) is designed to hold the upper tent portion (306) and the poles (316) as well as any other necessary gear. Additionally, the rescue enclosure (300) may also feature ropes or wires that form a lifting system (326) that allows the rescue enclosure (300) and litter basket (302) to be raised or lowered, particularly from an aircraft, such as a helicopter. The tub bottom (304) may also optionally feature a two-piece system (328) as shown in FIG. 3*c*. This two-piece system (328) is preferably held together by Velcro™ or another similar attachment means, such as snaps, hooks, or clasps. The two-piece system (328) allows for easy separation of the outer sides of the tub bottom to allow for the accommodation of various belts that are typically used with litter baskets (302). While maintaining the rescue enclosure (300) on the litter basket (302), the two sides (330*a*, 330*b*) of the two-piece system (328) can be separated, allowing the straps (332) to come through the rescue enclosure (300). The flexibility of the two-piece system (328) allows straps from multiple brands and types of litter baskets (302) to be easily accommodated. Additionally, the upper tent portion (306) may also feature one or more high visibility panels that can be orange or some other high visibility color, which can be pulled off or otherwise concealed as needed.

Figure 4A:
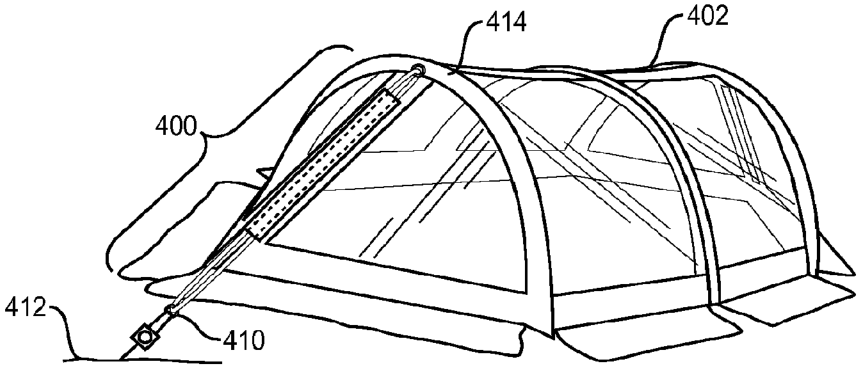
FIG. 4*a* is a detailed view of the tent with sliding mechanism of one embodiment of the present invention.
Figure 4B:
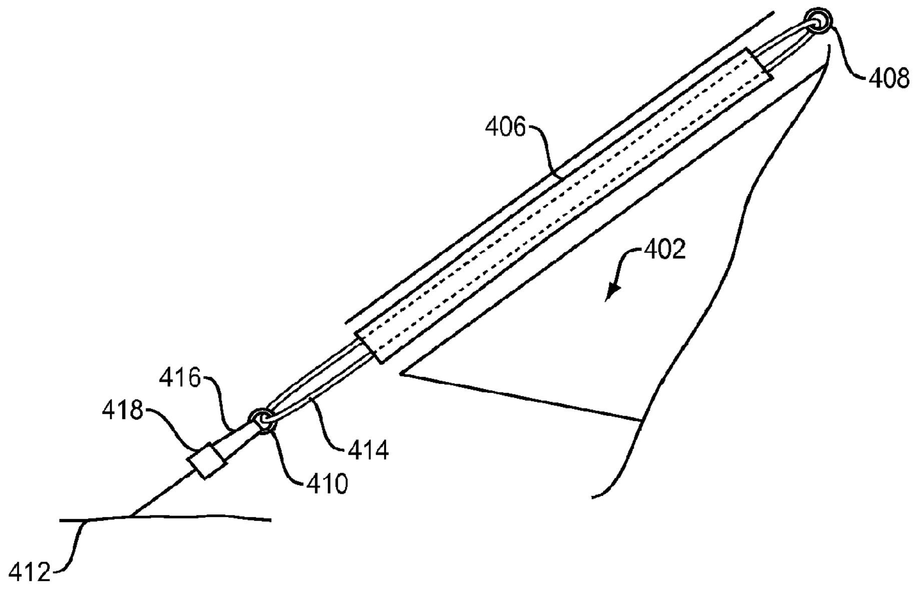
FIG. 4*b* is a detailed view of the sliding mechanism of one embodiment of the present invention.
Figure 4C:
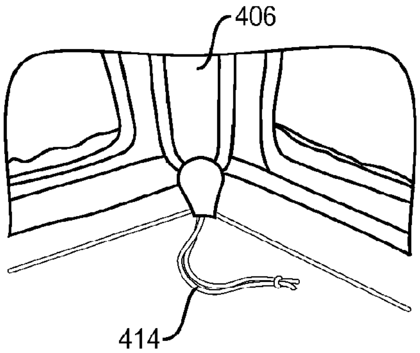
FIG. 4*c* is a detailed internal tent view of the internal draw cord of one embodiment of the present invention.

In a further embodiment of the present invention, a sliding mechanism (400), FIGS. 4*a*-4*c* is positioned on a tent (402) in order to allow for simple raising and lowering of a portion of the tent (402) as shown in FIG. 4*a*. The sliding mechanism (400) may be positioned at any point on the tent, however the sliding mechanism (400) is preferably positioned at the front or rear of the tent. The sliding mechanism (400) features a cord (404) that runs within an internal pocket or sleeve (406). The cord (404) can be rope, string, or any similar suitable material. The cord (404) operates similarly to a clothesline in that it runs from an upper grommet (408) down and through the internal pocket (406) to a lower grommet (410) and then back up and through the internal pocket (406). The upper grommet (408) is attached to the tent (402) and may be attached to a point close to a first air beam or pole (414) of the tent (402). Preferably, the upper grommet is attachable to the rain shield of the tent and the rain shield is secured to the tent. The lower grommet (410) is attachable to a tab (416), which is then attachable to a cord tensioning device (418). The cord tensioning device (418) may be a cam lock or cord ladder lock or other similar mechanism. The cord tensioning device (418) is then attachable to a lower surface (412), such as the ground. The attachment of the cord tensioning device (418) to the lower surface (412) may be via a stake or similar anchor mechanism to the lower surface (412). An internal draw cord (414) is located on the internal part of the tent and is attached to the lower grommet (410). A user can grasp the internal draw cord (414) and pull or release, thereby causing the front portion of the tent to be raised or lowered into an infinite amount of positions. The tent of the present embodiment may feature multiple doors or openings on the sides of the tent and may also feature a lower portion of the tent or rain shield that is comprised of a mesh material that allows for a user to see out of the tent but not into the tent.

Figure 5:
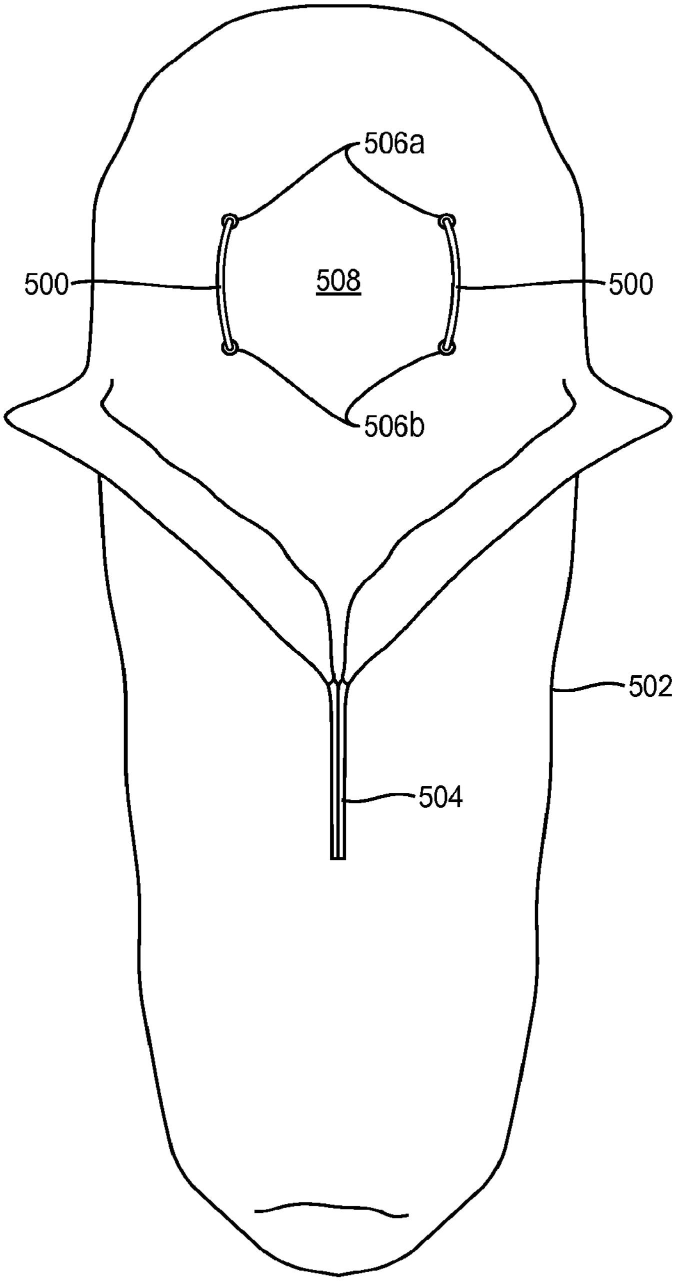
FIG. 5 is a detailed view of the shoulder strap embodiment of the present invention.

In yet another embodiment of the present invention, shoulder straps (500), FIG. 5, are provided for use with a sleeping bag (502). The sleeping bag may be a mummy-style sleeping bag that features a center zipper (504). The shoulder straps (500) are lightweight in design and may be at least semi-flexible through the use of an elastic or stretchable material. The shoulder straps attach at two points (506*a*, 506*b*) on the interior back side (508) of the sleeping bag (502). A user in the sleeping bag (502) can place the shoulder straps (500) over their shoulders or upper arms and unzip the zipper 504. The user is then free to move their arms around while the sleeping bag (502) back and sides remains in close contact with the user's back and sides, which will keep the user warm and comfortable while they engage in tasks such as cooking. The shoulder straps (500) allow for full arm use by the user.

Figure 6A:
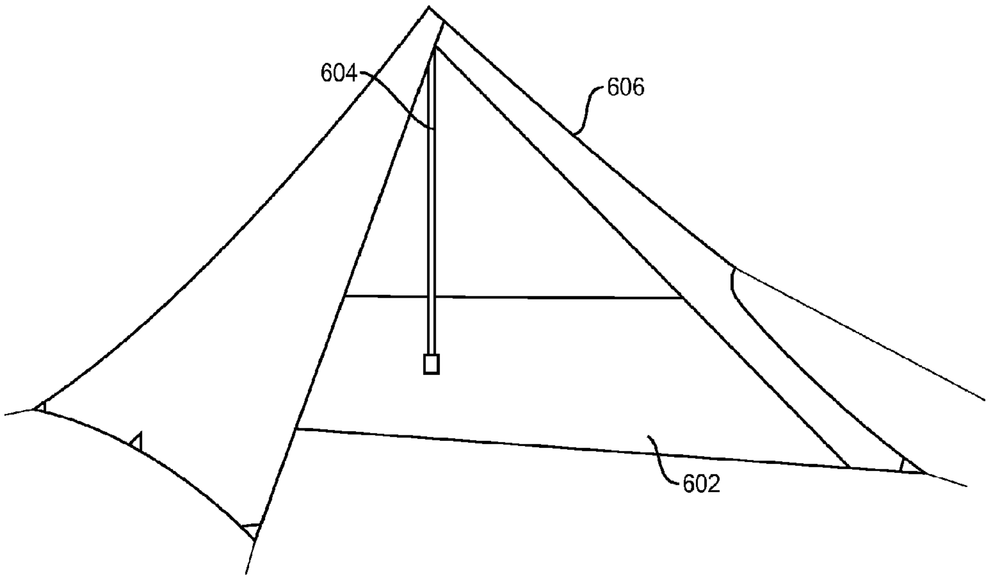
FIG. 6*a* is a view of the holding device of one embodiment of the invention as used with a tent.
Figure 6B:
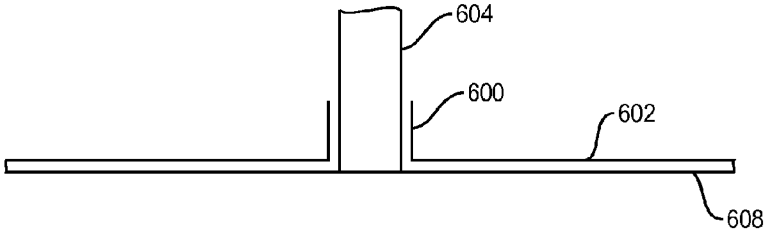
FIG. 6*b* is a detailed view of the holding device embodiment of the present invention.

In an additional embodiment of the present invention, a tent base or floor (602), FIGS. 6*a*-6*b*, is provided with a holding device (600) in the floor (602). The holding device (600) is configured to allow attachment of a pole (604) of a tent or other shelter (606). When a tent features a center pole (604), there is considerable tension placed on that center pole by wind and during adverse weather conditions such as snow and rain. Placing the center pole (604) directly onto the floor (602) will cause wear and abrasion at the contact area, which can lead to tears, leaks and other issues. The holding device (600) allows the center pole (604) to pass through the holding device (600) and then make direct contact with the ground (608). As a result, the center pole (604) wears into the ground (608) and not into the floor (602). The holding device (600) is weatherproof and makes close contact with the center pole (604), thereby blocking the entry of water or debris into the tent. The holding device (600) is ideally used with a single-pole pyramid-style tent, but can easily be used with other tent styles that require an internal pole or poles.

Figure 7A:
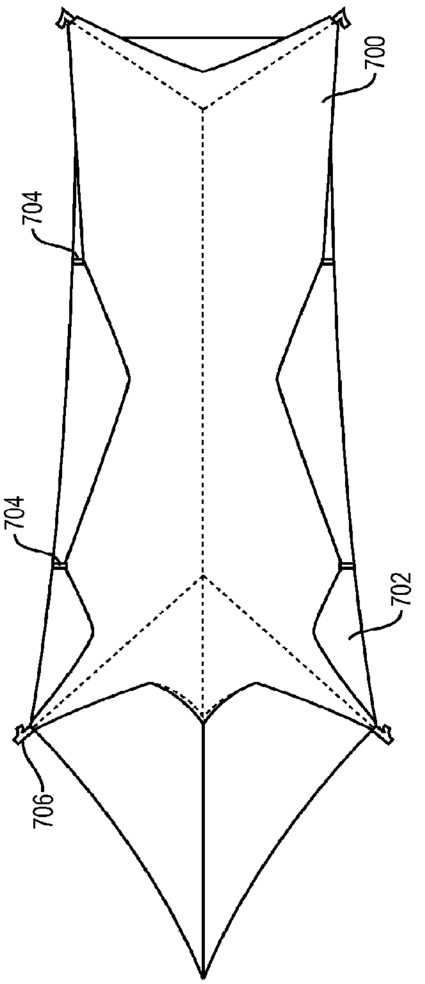
FIG. 7*a* is an overhead view of the interchangeable fly or cover of one embodiment of the present invention.
Figure 7B:
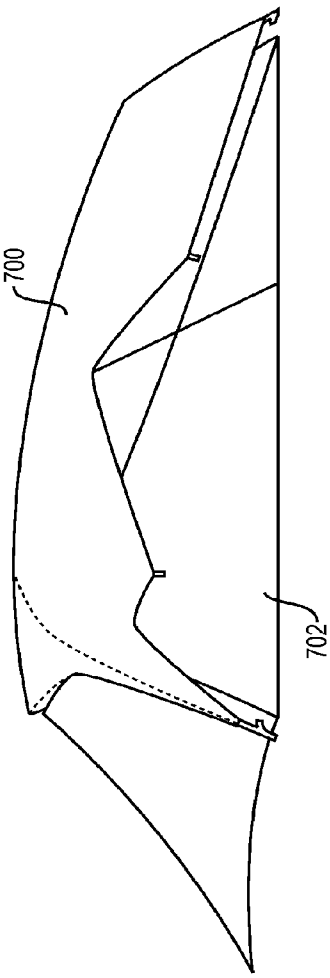
FIG. 7*b* is a side view of the interchangeable fly or cover of one embodiment of the present invention.

In yet another embodiment of the present invention, a tent is provided with an interchangeable fly or cover (700), FIGS. 7*a* and 7*b*. The cover (700) is created from an inexpensive fabric and does not need to provide rain protection. As a result, the cover (700) can be an irregular shape, which serves to create natural shadows that blend into the landscape. The interchangeable cover (700) allows for different colors or camouflage patterns to be applied to the same tent structure (702), which provides camouflaging protection in various landscapes and geographical settings. As an example, a tan colored cover (700) could be applied to the tent in a desert setting, while a green colored cover (700) could be applied to the tent in a heavily treed setting. The ability to change the cover easily allows for a less expensive alternative than having multiple tents in multiple color configurations for multiple situations. The cover (700) also serves to block IR signatures by covering over the poles of the tent (702). Additionally, the cover (700) provides additional sun protection and creates a shade barrier for the tent structure. The cover may feature webbing loops for guyout (704) and Jake's foot fly clip on adjustable webbing (706). Additionally, the material may be a combination of one or more materials depending on the application.

Figure 8A:
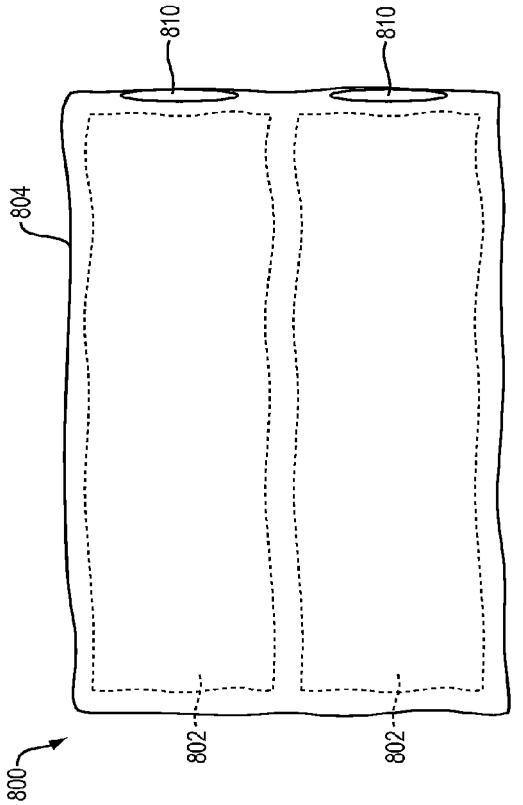
FIG. 8*a* is an overhead view of the modular sleep system of one embodiment of the present invention.
Figure 8B:
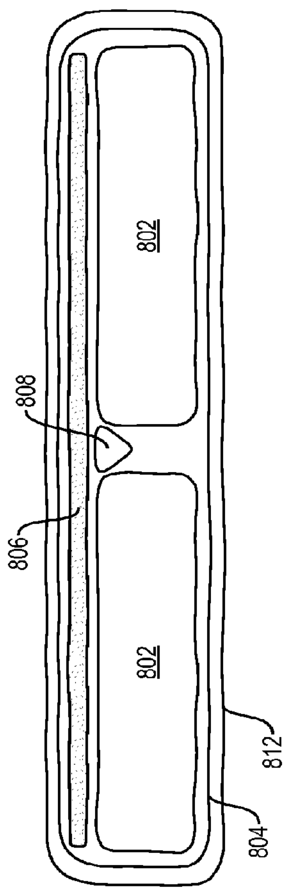
FIG. 8*b* is a cross-sectional view of the modular sleep system of one embodiment of the present invention.

In another embodiment of the present invention, a modular sleep system (800), FIGS. 8*a* and 8*b* is provided that allows for the combination of two individual sleeping pads (802) into one large sleeping pad enclosure for two or more people. The modular sleep system (800) allows a user to insert two individual sleeping pads (802) inside an outer shell (804). The outer shell (804) may include an upper foam layer (806) to provide more support. The upper foam layer (806) may be attached to the outer shell (804) or provided separately from the outer shell (804). Additionally, the modular sleep system (800) or the foam layer (806) may also feature a triangular or wedge shaped piece (808) to cover the gap located between the two individual sleeping pads (802). The modular sleep system (800) may also feature openings (810) at one end of the outer shell (804) to allow for easy inflation and deflation of the sleeping pads (802). The modular sleep system (800) may also feature a cover (812). The cover (812) at least partially surrounds the outer shell (804). The cover (812) is preferably machine washable and may be made from a material such as polyester microsuede. It is contemplated and within the scope of the present invention, that the modular sleep system disclosed above may be configured to hold only a single sleeping pad. In this embodiment, the cover, outer shell and foam layer would surround and support a single sleeping pad.

Modifications and substitutions by one of ordinary skill in the art are considered to be within the scope of the present invention, which is not to be limited except by the allowed claims and their legal equivalents.

The invention claimed is:

1. A cloaking pouch for holding a device, said cloaking pouch comprising:

a layer of foam that includes an upper side, a lower side, a first end and a second end;

three or more wrapping layers, layered one on top of each other, wherein said three or more wrapping layers at least partially surround said upper side, said first end and said lower side of said layer of foam;

three or more layers of conductive material, layered one on top of each other, wherein one of said layers of said three of more layers of conductive material is configured to be placed in direct contact with said three or more wrapping layers;

at least one stitch, wherein said at least one stitch passes through said three or more layers of conductive material, through said three or more wrapping layers on said upper side of said foam, through said foam, and through said three or more wrapping layers on said lower side of said foam.

* * * * *